United States Patent [19]
Pasotti et al.

[11] Patent Number: 6,034,888
[45] Date of Patent: Mar. 7, 2000

[54] READING CIRCUIT FOR NONVOLATILE ANALOG MEMORIES, IN PARTICULAR FLASH-EEPROM MEMORIES, WITH DIRECT AND CONSTANT CURRENT THRESHOLD VOLTAGE READING

[75] Inventors: Marco Pasotti, S. Martino Siccomario; Roberto Canegallo, Tortona; Ernestina Chioffi, Pavia; Giovanni Guaitini, Trecella, all of Italy; Cedric Issartel, Grenoble, France; Pier Luigi Rolandi, Monleale, Italy

[73] Assignee: STMicroelectronics S.R.L., Agrate Brianza, Italy

[21] Appl. No.: 09/239,027

[22] Filed: Jan. 27, 1999

[30] Foreign Application Priority Data

Jan. 27, 1998 [IT] Italy .................................. TO98A0068

[51] Int. Cl.$^7$ ................................................... G11C 16/04
[52] U.S. Cl. ............................... 365/185.03; 365/185.18; 365/185.2
[58] Field of Search ......................... 365/185.03, 185.18, 365/185.2, 45

[56] References Cited

U.S. PATENT DOCUMENTS

| 5,745,414 | 4/1998 | Engh et al. | 365/185.2 |
| 5,808,938 | 9/1998 | Tran et al. | 365/185.03 |
| 5,838,612 | 11/1998 | Calligaro et al. | 365/185.03 |
| 5,946,235 | 8/1999 | Kramer et al. | 365/185.19 |

Primary Examiner—Son T. Dinh
Attorney, Agent, or Firm—Theodore E. Galanthay; E. Russell Tarleton; Seed and Berry LLP

[57] ABSTRACT

The reading circuit comprises a current source, which, via a current reflection circuit, supplies a constant predetermined current to a cell to be read, an operational amplifier with a non-inverting input connected to the drain terminal of the cell, and an output connected to the gate terminal of the cell. The source terminal of the cell is connected to ground. Thereby the output voltage of the operational amplifier supplies directly (at the set current) the threshold voltage of the cell, and the drain terminal of the cell is biased to a positive voltage.

18 Claims, 1 Drawing Sheet

READING CIRCUIT FOR NONVOLATILE ANALOG MEMORIES, IN PARTICULAR FLASH-EEPROM MEMORIES, WITH DIRECT AND CONSTANT CURRENT THRESHOLD VOLTAGE READING

TECHNICAL FIELD

The present invention relates to a reading circuit for nonvolatile analog memories, in particular flash-EEPROM memories, as defined in the preamble of claim 1.

BACKGROUND OF THE INVENTION

At present various reading circuits (so-called sense amplifiers) are known, for reading analog or multi-level threshold voltage of nonvolatile memory cells. Two embodiments are for example illustrated in FIGS. 2 and 5 of European patent application 96830612.6 of Dec. 5, 1996 in the name of the same applicant. According to these solutions, the drain (or source) terminal is connected to a current source, which sets the current flowing in the memory cell (bias current), as well as to the inverting input of an operational amplifier; the source (or drain) terminal is biased to a constant voltage; and the gate terminal is connected to the output of the operational amplifier, the non-inverting input of which receives a reference voltage with a predetermined value (for example it is connected to ground). The reading circuit thus forms a closed-loop circuit wherein the output voltage of the operational amplifier is the same as the gate-source voltage of the cell (optionally minus the reference voltage, which has a known value), wherein the cell overdrive (difference between the voltage applied between the source and drain terminals of the cell and its zero current threshold voltage) is constant, and is set by the current source. As a result, the output voltage of the operational amplifier is equal to the cell threshold voltage, measured at the set bias current.

In this known solution, when the drain terminal is connected to the operational amplifier, advantageously, the cell constant current threshold voltage is read directly and the gate voltage and thus the stresses of the gate region (gate stress) are minimized. On the other hand, it is disadvantageous for the gate voltage to be negative, since this requires generation of appropriate reference voltages, and there are increased difficulties in designing the operational amplifier; in addition, it is disadvantageous for the parasitic drain capacitance (which is approximately 2 pF) to be driven by the transconductance of the flash cell.

In the second solution the problem caused by the presence of a negative voltage at the drain terminal is avoided, however the high capacitance present at the source terminal of flash cells (approximately 1 nF) becomes sensible, and reading memory arrays with a high number of cells becomes slow.

A different solution is provided in European patent application no. 97830172.9 of Apr. 15, 1997 in the name of the same applicant, wherein the drain terminals of the cell to be read and of a reference cell are connected to the two output nodes of a current mirror circuit, and to respective inputs of an operational amplifier, and the output of the operational amplifier is connected to the gate terminal of the reference cell. Thereby a feedback loop comprising the reference cell is provided, and the output of the operational amplifier is linearly linked to the zero current threshold voltage of the cell to be read, minus the zero current threshold voltage of the reference cell and the gate voltage of the cell to be read.

Advantageously, this solution provides a very fast reading (0.3 µs), since the increased parasitic capacitance (capacitance associated with the gate terminal of the array cell to be read) is excluded from the feedback loop, whereas the drain capacitance is driven by the transconductance (which is high) of an NMOS biasing transistor, forming a cascode structure. This solution also permits parallel reading of different cells of the array. A variant of this solution uses a MOS transistor as a reference element.

The disadvantage of this solution consists in the fact that reading is carried out indirectly, i.e., a reference device is needed, the features whereof are as constant as possible over a period of time, and with use. This condition is particularly critical if a memory cell is used as a reference. In addition, in this solution, the gate voltage of all the cells arranged on the line of the cell to be read must always be set to the maximum value, and thus the stress at the gate region of these cells is maximal.

SUMMARY OF THE INVENTION

The object of the present invention is to provide a reading circuit which eliminates the above-described disadvantages of the known solutions.

According to the present invention, a reading circuit is provided for nonvolatile analogue memories, in particular flash-EEPROM memories having in one embodiment a feedback loop, including an operational amplifier connected between a first terminal and a gate terminal of a cell to be read, as well as a current source supplying a constant predetermined current to the cell, with the first terminal of the cell connected to the non-inverting input of the operational amplifier.

BRIEF DESCRIPTION OF THE DRAWINGS

The invention is now described with reference to the attached drawings, which illustrate non-limiting examples of the invention, wherein.

DETAILED DESCRIPTION OF THE INVENTION

Figure 1:
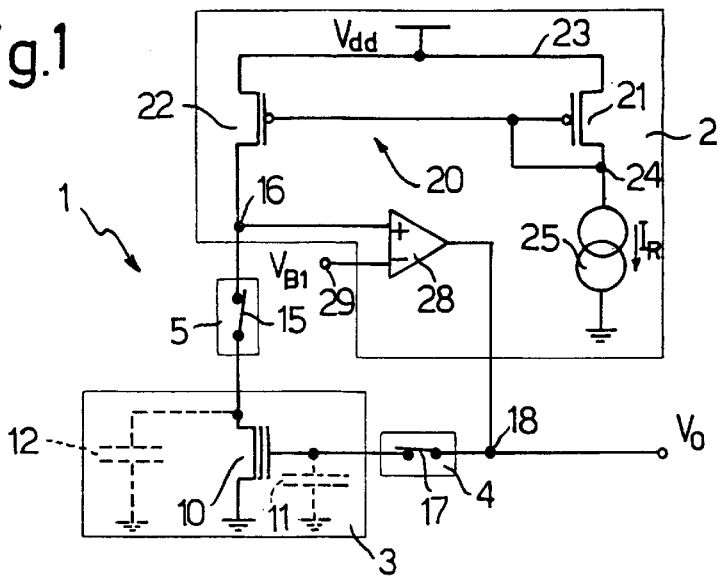
FIG. 1 shows a circuit diagram of a first embodiment of the present invention.

FIG. 1 shows schematically a memory 1 of flash-EEPROM type, whereof a reading circuit (generally known as a sense amplifier) 2, a memory array 3, a line decoder 4 and a column decoder 5 are shown. In particular, of memory array 3, only a cell 10, the threshold voltage whereof is to be read, and parasitic capacitors 11 and 12 are shown, representing respectively the gate and drain capacitances associated with the corresponding terminals of the cell 10.

In detail, cell 10 has a source terminal connected to ground, a drain terminal connected to column decoder 5, and a gate terminal connected to line decoder 4. Of column decoder, only a switch 15 is shown, connecting the drain terminal of the cell 10 to a node 16 of the reading circuit 2; similarly, of the line decoder only a switch 17 is shown, connecting the gate terminal of cell 10 to a node 18 defining the output of reading circuit 2.

Reading circuit 2 comprises a current mirror circuit 20, formed by a first transistor 21 and by a second transistor 22 of PMOS type, which have source terminals both connected to a supply line 23, set to the voltage $V_{dd}$; gate terminals connected together and to a node 24; and drain terminals connected respectively to node 24 and to node 16. First transistor 21 is then diode-connected. Node 24 is also connected to a current source 25, providing a constant current $I_R$. Finally, reading circuit 2 comprises an operational amplifier 28 having a non-inverting input connected to node 16, an inverting input connected to an input node 29 and supplied with a voltage $V_{B1}$, and an output connected to node 18. Node 18 then supplies an output voltage $V_o$ of operational amplifier 28.

In the circuit of FIG. 1, at equilibrium, the voltage present at node 16 is the same as voltage $V_{B1}$, which thus determines the drain voltage of cell 10, minus the drop at switch 15, which is negligible. In addition, current mirror circuit 20 reflects current $I_R$ at node 16, and consequently current $I_D$ entering the drain terminal of cell 10 is set, and is the same as $I_R$. The drain voltage of cell 10 is positive, owing to the configuration of the circuit and the current flow direction. Here, the overdrive voltage $V_{ov}$ of cell 10 is constant, since, in the first approximation:

$$I_D = I_R = KV_{ov}^2 = K(V_{gs} - V_{th})^2$$

wherein K is a constant dependant on the production process, $V_{gs}$ is the gate-source drop of cell 10, and $V_{th}$ is the threshold voltage with theoretically zero current (when the cell starts conducting).

Since:

$$V_{gs} = V_o = V_{th} + V_{ov}$$

the gate-source drop $V_{gs}$ of the cell, when balanced, is given by the sum of the threshold voltage, with theoretically zero current, and a constant term depending on the set current (overdrive voltage $V_{ov}$). Consequently, naming predetermined current-threshold voltage the gate voltage (measured with respect to ground) such that a predetermined current (current set $I_R$) flows in the cell 10, the output voltage $V_o$ of circuit 2 gives the set current-threshold voltage of cell 10.

As already stated, in the circuit of FIG. 1, the voltage at the drain terminal of cell 10 is positive, and thus the above-described problems which arise when the drain voltage is negative do not exist. In addition, the NMOS transistor, generally arranged in series to column decoder 15, with the function of limiting the drain voltage of cell 10, is not necessary (and in fact is not shown); the circuit is thus particularly simple, however in some situations node 16 can be a source of instability.

Figure 2:
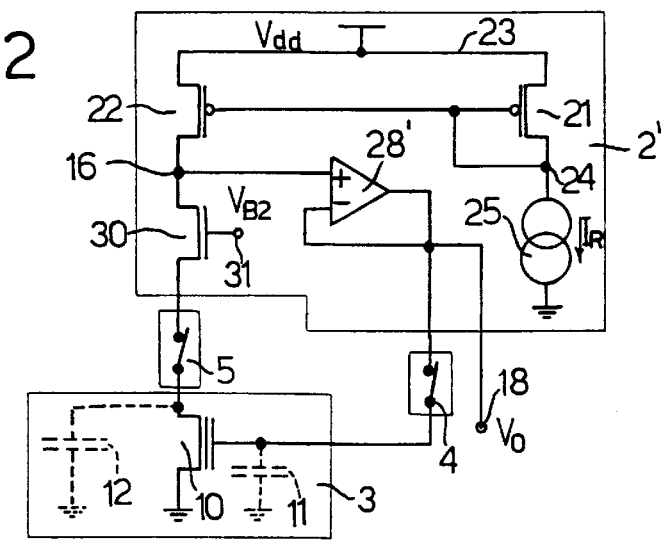
FIG. 2 shows a second embodiment of the invention.

In this case, the configuration of FIG. 2 can be used, wherein the elements common to the embodiment of FIG. 1 have the same reference numbers, and are not described again.

With reference to FIG. 2, the reading circuit, now indicated at 2', comprises an operational amplifier 28', connected as voltage follower. In detail, the non-inverting input of operational amplifier 28' is again connected to node 16, but its inverting input is connected to the amplifier output (node 18). In addition, the Figure shows bias transistor 30 arranged between node 16 and column decoder 5, for biasing the drain terminal to a suitable reading voltage (generally approximately 300 mV). For this purpose, bias transistor 30 has a gate terminal connected to a node 31, supplied by a bias voltage $V_{B2}$ equal to the required drain voltage, plus the drop between the gate and source terminals of bias transistor 30 itself.

The operation of reading circuit 2' of FIG. 2 is the same as reading circuit 1 of FIG. 1, since also here, at equilibrium, the overdrive voltage is constant, and the operational amplifier 28' generates an output voltage $V_o$ equal to the gate-source drop $V_{gs}$ of cell 10, as determined by the current set by current source 25.

The circuit of FIG. 2 is also very simple, and operational amplifier 28' can be produced simply with a source follower. In this second embodiment, the circuit loop gain is provided at the node 16, introducing a pole slowing down the circuit, requiring a reading time of approximately 1 μs.

Figure 3:
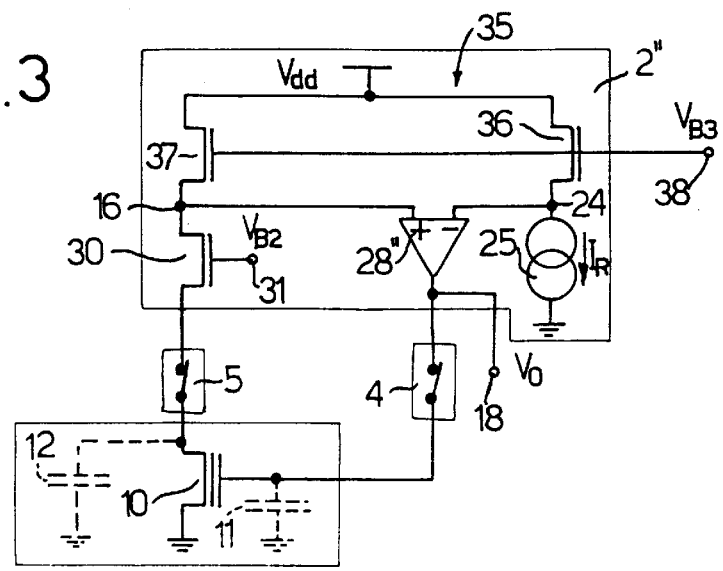
FIG. 3 illustrates a third embodiment of the invention.

In reading circuit 2" of FIG. 3, the current mirror circuit 20 is replaced by a virtual mirror circuit 35, comprising transistors 36, 37 of the NMOS type. In detail, NMOS transistors 36, 37 have drain terminals connected to supply line 23, gate terminals connected together and to a node 38, supplied with a voltage $V_{B3}$, and source terminals connected respectively to node 24 and node 16. The operational amplifier, here denoted by 28", has a non-inverting input connected to node 16, and an inverting input connected to node 24. The remainder of the reading circuit 2" in FIG. 3 is the same as the circuit 2' in FIG. 2.

In the circuit in FIG. 3, the transistor 36 has gate and drain terminals set to predetermined voltages (equal to $V_{B3}$ and $V_{dd}$ respectively), and is passed by current $I_R$, set from the exterior by current source 25. In this condition, the source voltage of the transistor (voltage present at node 24) is determined. In addition, at equilibrium, the voltage at nodes 16 and 24 is maintained the same by operational amplifier 28", such that the transistor 37 has the same source voltage as transistor 36. In this situation, transistors 36 and 37 act like a mirror circuit, similarly to mirror circuits 20 of FIGS. 1 and 2, and inject in cell 10 a current equal to $I_R$. Thus, they define the above-described virtual mirror circuit 35.

In the circuit of FIG. 3, the above considerations apply, and output voltage $V_o$ is the same as threshold voltage of cell 10, at the set bias current. The circuit of FIG. 3 thus also provides direct reading of this voltage.

In the circuit of FIG. 3, operational amplifier 28" represents the gain stage of the feedback loop. The pole at node 16 is now at higher frequencies than in the circuit of FIG. 2, since it is driven by a higher transconductance, and the circuit is faster (reading time of approximately 0.5 μs).

The advantages of the described reading circuit are apparent from the preceding description. However, it is stressed that all three circuits provide a direct reading of the threshold voltage with a predetermined current, and do not require negative biasing voltages. In addition, it is no longer necessary to have reference devices (cells or transistors) which can introduce conditions of time variability. The circuit described is thus reliable over a period of time.

Finally, it is apparent that modifications and variants can be made to the reading circuit described and illustrated here, without departing from the scope of the present invention, as defined in the attached claims.

We claim:

1. A reading circuit for nonvolatile analog memories, in particular flash-EEPROM memories, comprising a cell to be read and a feedback loop, including an operational amplifier having a non-inverting input connected to a first terminal of said cell and an output terminal connected to a gate terminal of said cell, a current source supplying a constant predetermined current to said cell.

2. The circuit of claim 1 wherein said first terminal of said cell is a drain terminal, and wherein said cell includes a source terminal connected to ground.

3. The circuit of claim 1, further comprising a current mirror circuit connected between said first terminal of said cell and said current source.

4. The circuit of claim 3 wherein said current mirror circuit comprises a first and a second PMOS transistor; said first PMOS transistor being diode-connected and having a source terminal connected to a reference potential line, and gate and drain terminals connected to one another and to said current source; said second PMOS transistor having a source terminal connected to said reference potential line, a gate terminal connected to said gate terminal of said first PMOS transistor, and a drain terminal connected to said first terminal of said cell.

5. The circuit of claim 4 wherein said operational amplifier has an inverting input biased to a first biasing voltage.

6. The circuit of claim 4 wherein said operational amplifier has an inverting input and an output connected together and to said gate terminal of said cell.

7. The circuit of claim 6 wherein said operational amplifier is a source follower.

8. The circuit of claim 3 wherein said current mirror circuit comprises a first and a second NMOS transistor having drain terminals connected together and to a reference potential line, gate terminals connected together and biased to a second biasing voltage, and source terminals connected respectively to said current source and to said first terminal of said cell.

9. The circuit of claim 8 wherein said operational amplifier has an inverting terminal connected to said drain terminal of said first NMOS transistor, said non-inverting input connected to said drain terminal of said second NMOS transistor.

10. A reading circuit, comprising:
  a cell to be read having source, drain, and gate terminals, the source terminal connected to ground;
  an operational amplifier having a non-inverting input connected to the drain terminal of the cell, an output terminal connected to the gate of the cell, and an inverting input connected to a first biasing voltage source;
  a current source supplying a constant current to the cell; and
  a current mirror comprising first and second transistors that are diode connected, the first transistor for having a source terminal connected to a reference potential line, and gate and drain terminals connected to one another and to the current source, the second transistor having a source terminal connected to the reference potential line, a gate terminal connected to the gate terminal at the first transistor, and a drain terminal connected to the drain terminal of the cell to bias the drain terminal of the cell to a positive voltage.

11. The circuit of claim 10 wherein the first and second transistors are of the PMOS type.

12. The circuit of claim 10, further comprising a column decoder connected between the drain terminal of the cell and the non-inverting input of the operational amplifier.

13. The circuit of claim 12, further comprising a line decoder connected between the gate terminal of the cell and an output of the circuit.

14. A reading circuit, comprising:
  a cell to be read having source, drain, and gate terminals, the source terminal connected to ground;
  an operational amplifier having a non-inverting input connected to the drain terminal of the cell, an inverting input connected to the current source, and an output terminal connected to the gate of the cell and to an output of the reading circuit;
  a current source supplying a constant predetermined current to the cell;
  a current mirror comprising first and second transistors having source terminals connected to a reference potential line, gate terminals connected to one another and to a biasing voltage; and
  source terminals connected respectively to the current source and to the drain terminal of the cell to bias the drain terminal of the cell to a positive voltage.

15. The circuit of claim 14 wherein the first and second transistors are of the NMOS type.

16. The circuit of claim 15, further comprising a third transistor connected between the second transistor and the cell and having a source terminal connected to the drain terminal of the cell, a drain terminal connected to the source terminal of the second transistor, and a gate terminal connected to a second biasing voltage.

17. The cell of claim 16, further comprising a column decoder connected between the drain terminal of the cell and the source terminal of the third transistor.

18. The cell of claim 17, further comprising a line decoder connected between the gate terminal of the cell and the output of the operational amplifier.

* * * * *